United States Patent
Lee (10) Patent No.: US 12,237,044 B2
(45) Date of Patent: Feb. 25, 2025

(54) IMPEDANCE CALIBRATION CIRCUIT, MEMORY CONTROLLER INCLUDING THE IMPEDANCE CALIBRATION CIRCUIT AND MEMORY SYSTEM INCLUDING THE MEMORY CONTROLLER

(71) Applicant: SK hynix Inc., Icheon-si (KR)

(72) Inventor: In Soo Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 125 days.

(21) Appl. No.: 18/186,708

(22) Filed: Mar. 20, 2023

(65) Prior Publication Data

US 2024/0144981 A1  May 2, 2024

(30) Foreign Application Priority Data

Oct. 28, 2022 (KR) .................. 10-2022-0141441

(51) Int. Cl.
*G11C 7/00* (2006.01)
*G11C 7/10* (2006.01)
*H03K 19/00* (2006.01)

(52) U.S. Cl.
CPC ....... *G11C 7/1048* (2013.01); *H03K 19/0005* (2013.01); *G11C 2207/2254* (2013.01)

(58) Field of Classification Search
CPC ....... G11C 7/1078; G11C 7/22; G11C 7/1006; G11C 7/1072; G11C 7/1096
USPC ...................................... 365/189.16, 189.14
See application file for complete search history.

(56) References Cited

U.S. PATENT DOCUMENTS

| | | | |
|---|---|---|---|
| 10,069,495 B2 | 9/2018 | Jung et al. | |
| 10,083,763 B2 | 9/2018 | Jang et al. | |
| 10,917,093 B1* | 2/2021 | He | G11C 11/4093 |

* cited by examiner

*Primary Examiner* — Son T Dinh
(74) *Attorney, Agent, or Firm* — WILLIAM PARK & ASSOCIATES LTD.

(57) ABSTRACT

A first impedance calibration part configured to perform a first impedance calibration operation of generating a first impedance calibration code set for adjusting an impedance of a first terminating resistor to a first target value, with reference to an external resistor having a first resistance value. A second impedance calibration part configured to perform a second impedance calibration operation of generating a second impedance calibration code set for adjusting an impedance of a second terminating resistor to a second target value, with reference to a reference resistance unit, a resistance value of which is set to a second resistance value according to a part of the first impedance calibration code set.

16 Claims, 7 Drawing Sheets

IMPEDANCE CALIBRATION CIRCUIT, MEMORY CONTROLLER INCLUDING THE IMPEDANCE CALIBRATION CIRCUIT AND MEMORY SYSTEM INCLUDING THE MEMORY CONTROLLER

CROSS-REFERENCE TO RELATED APPLICATION

The present application claims priority under 35 U.S.C. § 119(a) to Korean application number 10-2022-0141441, filed on Oct. 28, 2022, in the Korean Intellectual Property Office, which is incorporated herein by reference in its entirety as set forth in full.

BACKGROUND

1. Technical Field

Various embodiments generally relate to a semiconductor circuit, and, more particularly, to an impedance calibration circuit, a memory controller including the impedance calibration circuit and a memory system including the memory controller.

2. Related Art

As an operating speed of a semiconductor apparatus becomes greater, a swing width of a signal input to/output from the semiconductor apparatus becomes more reduced and signal distortion becomes more serious due to the impedance mismatch. In order to solve the signal-distortion issue, introduced is an impedance calibration circuit for adjusting, by utilizing an external resistor, a termination impedance of the semiconductor apparatus to become stable regardless of a process, voltage and temperature (PVT) variation. A controller for controlling a memory module includes a plurality of terminating circuits. The termination impedance specification is differently required for each of the terminating circuits. There is a need for solving issues regarding the size of the impedance calibration circuit and the increase of time for adjusting the termination impedance due to the plurality of terminating circuits.

SUMMARY

In an embodiment, an impedance calibration circuit may include a first impedance calibration part and a second impedance calibration part. The first impedance calibration part may be configured to perform a first impedance calibration operation of generating a first impedance calibration code set for adjusting an impedance of a first terminating resistor to a first target value, with reference to an external resistor having a first resistance value. The second impedance calibration part may be configured to perform a second impedance calibration operation of generating a second impedance calibration code set for adjusting an impedance of a second terminating resistor to a second target value, with reference to a reference resistance unit, a resistance value of which is set to a second resistance value according to a part of the first impedance calibration code set.

In an embodiment, a memory controller may include a front physical layer, a back physical layer and a processor. The front physical layer may include a first terminating resistor and a second terminating resistor, which have different terminating resistor specifications from each other, and may be configured to perform an interfacing operation with a host. The back physical layer may be configured to perform an interfacing operation with at least one memory apparatus. The processor may be configured to process a signal between the front physical layer and the back physical layer. The front physical layer may be configured to perform a first impedance calibration operation of generating a first impedance calibration code set and configured to perform a second impedance calibration operation of generating a second impedance calibration code set. The first impedance calibration code set may be for adjusting an impedance of the first terminating resistor to a first target value, with reference to an external resistor having a first resistance value. The second impedance calibration code set may be for adjusting an impedance of the second terminating resistor to a second target value, with reference to a reference resistance unit, a resistance value of which is set to a second resistance value according to a part of the first impedance calibration code set.

In an embodiment, a memory system may include a memory apparatus and a memory controller. The memory controller may be configured to control the memory apparatus in response to a request from a host and may include a first terminating resistor and a second terminating resistor, which have different terminating resistor specifications from each other according to the memory apparatus. The memory controller may be configured to perform a first impedance calibration operation of generating a first impedance calibration code set and configured to perform a second impedance calibration operation of generating a second impedance calibration code set. The first impedance calibration code set may be for adjusting an impedance of the first terminating resistor to a first target value, with reference to an external resistor having a first resistance value. The second impedance calibration code set may be for adjusting an impedance of the second terminating resistor to a second target value, with reference to a reference resistance unit, a resistance value of which is set to a second resistance value according to a part of the first impedance calibration code set.

DETAILED DESCRIPTION

In accordance with an embodiment, provided may be an impedance calibration circuit capable of satisfying different termination specifications by utilizing only a single external resistor, a memory controller including the impedance calibration circuit and a memory system including the memory controller.

In accordance with an embodiment, provided may be an impedance calibration circuit capable of simplifying an impedance calibration operation as well as reducing time required for the impedance calibration operation, a memory controller including the impedance calibration circuit and a memory system including the memory controller.

Hereinafter, examples of embodiments of the present disclosure will be described with reference to the accompanying drawings.

As used herein, the terms such as "first" and "second" are used only for distinction between elements and are not used for limitation of the elements or for indication of a particular sequence. As used herein, when an element is expressed as "coupled to" or "connected to" the other element, the element may be electrically or mechanically coupled to or connected to the other element in a direct manner or a coupling relationship or a connection relationship may be electrically or mechanically formed through an intervention of intermediate element between the element and the other element. As used herein, the term "predetermined" may mean that a value of a parameter is pre-determined when a process or an algorithm uses the parameter. According to an embodiment, the value of the parameter may be set when the process or the algorithm starts or while the process or the algorithm is being executed. As used herein, the terms "logic high level" and "logic low level" may be used for describing logic levels of signals. A signal having a "logic high level" is different from a signal having a "logic low level". For example, when a first voltage corresponds to a "logic high level", a second voltage may correspond to a "logic low level". According to an embodiment, a "logic high level" may be higher than a "logic low level". According to an embodiment, logic levels of signals may be embodied as different logic levels or opposite logic levels. For example, according to an embodiment, a signal having a logic high level may be embodied to have a logic low level and a signal having a logic low level may be embodied to have a logic high level.

Hereinafter, detailed embodiments of the present disclosure will be described.

Figure 1:
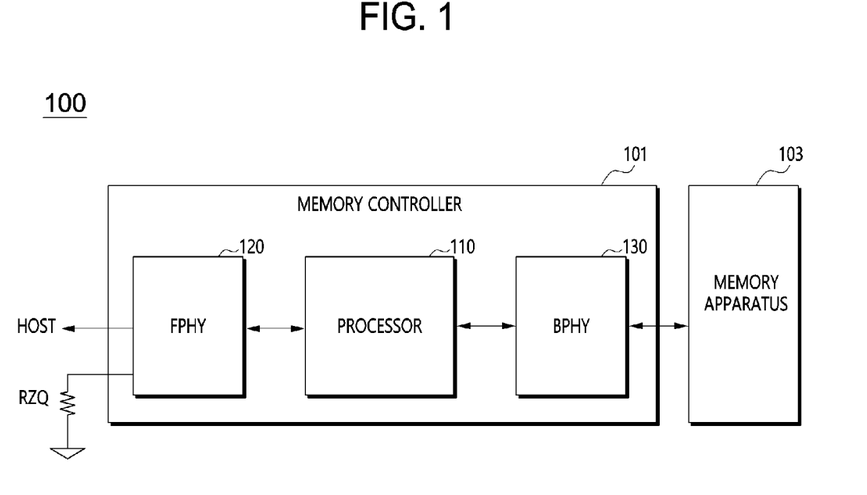
FIG. 1 is a diagram illustrating a configuration of a memory system in accordance with an embodiment.

FIG. 1 is a diagram illustrating a configuration of a memory system 100 in accordance with an embodiment.

Referring to FIG. 1, the memory system 100 may be a memory module, e.g., a dual in-line memory module (DIMM) including a memory controller 101 and a memory apparatus 103.

The memory apparatus 103 may include a plurality of semiconductor memories.

The memory controller 101 may control the memory apparatus 103 in response to a request from a host. The memory controller 101 may receive a command and/or an address from the host. The memory controller 101 may control data communication between the host and the memory apparatus 103. The memory controller 101 may be configured to perform a first impedance calibration operation of generating a first impedance calibration code set and may perform a second impedance calibration operation of generating a second impedance calibration code set. The first impedance calibration code set may be for adjusting an impedance of a first terminating resistor to a first target value, with reference to an external resistor RZQ having a first resistance value. The second is impedance calibration code set may be for adjusting an impedance of a second terminating resistor to a second target value, with reference to a reference resistance unit, a resistance value of which is set to a second resistance value according to a part of the first impedance calibration code set. The memory controller 101 may perform the first impedance calibration operation while being connected to the external resistor RZQ. The memory controller 101 may perform the second impedance calibration operation while the first impedance calibration operation is being performed.

The memory controller 101 may include a processor 110, a front physical layer (FPHY) 120 and a back physical layer (BPHY) 130. The processor 110 may process a signal transferred between the front physical layer 120 and the back physical layer 130. The front physical layer 120 may include a first terminating resistor and a second terminating resistor, the first and second terminating resistors having different terminating resistor specifications from each other. The front physical layer 120 may perform an interfacing operation with a host HOST. The front physical layer 120 may perform the first impedance calibration operation while being connected to the external resistor RZQ. The front physical layer 120 may perform the second impedance calibration operation while the first impedance calibration operation is being performed. The back physical layer 130 may perform an interfacing operation with the memory apparatus 103.

Figure 2:
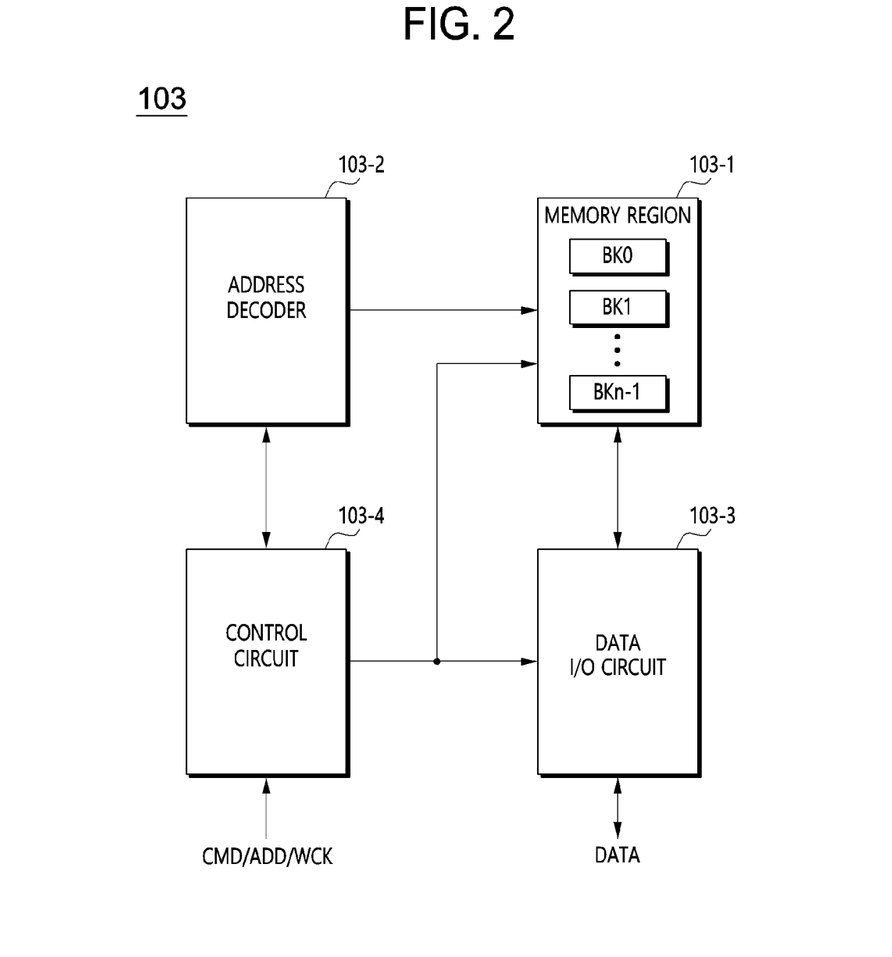
FIG. 2 is a diagram illustrating a configuration of a memory apparatus in accordance with an embodiment.

FIG. 2 is a diagram illustrating a configuration of the memory apparatus 103 in accordance with an embodiment.

Referring to FIG. 2, the memory apparatus 103 may include a memory region 103-1, an address decoder 103-2, a data input/output circuit 103-3 and a control circuit 103-4.

The memory region 103-1 may include a plurality of memory cells. The plurality of memory cells may include at least one of a volatile memory and a non-volatile memory. The volatile memory may include a static random-access memory (static RAM: SRAM), a dynamic RAM (DRAM) and a synchronous DRAM (SDRAM). The non-volatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM) and a ferroelectric RAM (FRAM). Data may be output from the memory region 103-1 during a read operation of the memory apparatus 103. Data from the memory controller 101 may be stored into the memory region 103-1 during a write operation of the memory apparatus 103. The memory cells within the memory region 103-1 may be divided into a plurality of unit memory regions, e.g., a plurality of memory banks BK0 to BKn-1.

The address decoder 103-2 may be coupled to the control circuit 103-4 and the memory region 103-1. The address decoder 103-2 may decode an address signal from the control circuit 103-4 and may access the memory region 103-1 according to a result of the decoding.

The data input/output circuit 103-3 may be coupled to the memory region 103-1. The data input/output circuit 103-3 may is exchange data with the memory controller 101 or/and the memory region 103-1. The data input/output circuit 103-3 may include a data input buffer, a data output buffer, a data input/output pad DQ, a pipe register, a test-related circuit and so forth.

The control circuit 103-4 may be coupled to the memory region 103-1, the address decoder 103-2 and the data input/output circuit 103-3. The control circuit 103-4 may perform a control operation regarding a test operation, a read operation, a write operation and an address process of the memory apparatus 103. The control circuit 103-4 may receive, through a plurality of pads (not illustrated), a command CMD, an address ADD and a clock signal WCK. The control circuit 103-4 may provide the data input/output circuit 103-3 with the address, which is decoded by the address decoder 103-2.

Figure 3:
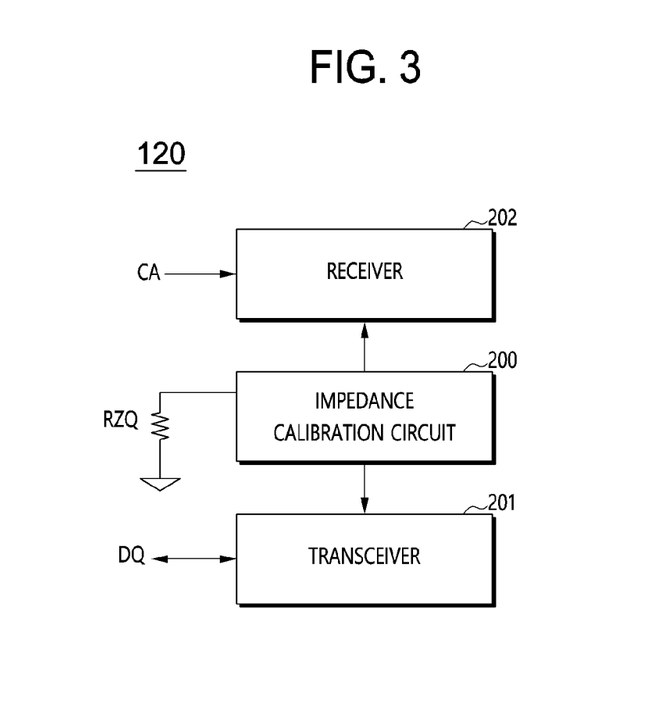
FIG. 3 is a diagram illustrating a configuration of a front physical layer illustrated in FIG. 1.

FIG. 3 is a diagram illustrating a configuration of the front physical layer (FPHY) 120 illustrated in FIG. 1.

Referring to FIG. 3, the front physical layer 120 may include a transceiver 201, a receiver 202 and an impedance calibration circuit 200.

The impedance calibration circuit 200 may be configured to perform a first impedance calibration operation of generating a first impedance calibration code set and may perform a second impedance calibration operation of generating a second impedance calibration code set. The first impedance calibration code set may be for adjusting an impedance of a first terminating resistor to a first target value, with reference to an external resistor RZQ having a first resistance value. The second impedance calibration code set may be for adjusting an impedance of a second terminating resistor to a second target value, with reference to a reference resistance unit, a resistance value of which is set to a second resistance value according to a part of the first impedance calibration code set. The impedance calibration circuit 200 may provide the first impedance calibration code set to the transceiver 201 and may provide the second impedance calibration code set to the receiver 202.

The transceiver 201 may be coupled to the data input/output pad DQ and may include a driver having the first terminating resistor configured for impedance matching of the data input/output pad DQ. The driver may include a pull-up unit and a pull-down unit. The data input/output pad DQ may get the impedance adjusted according to an operation specification of the memory apparatus 103, e.g., according to the high tapped termination (HTT) of the specification of DDR4. The first terminating resistor may get the impedance adjusted according to the first impedance calibration code set.

The receiver 202 may be coupled to a command/address input pad CA and may include a driver having the second terminating resistor configured for impedance matching of the command/address input pad CA. The driver may include a pull-up unit and a pull-down unit. The command/address input pad CA may get the impedance adjusted according to an operation specification of the memory apparatus 103, e.g., according to the center tapped termination (CU) of the specification of DDR4 registering clock driver (RCD) input bus is termination (IBT). The second terminating resistor may get the impedance adjusted according to the second impedance calibration code set.

Figure 4:
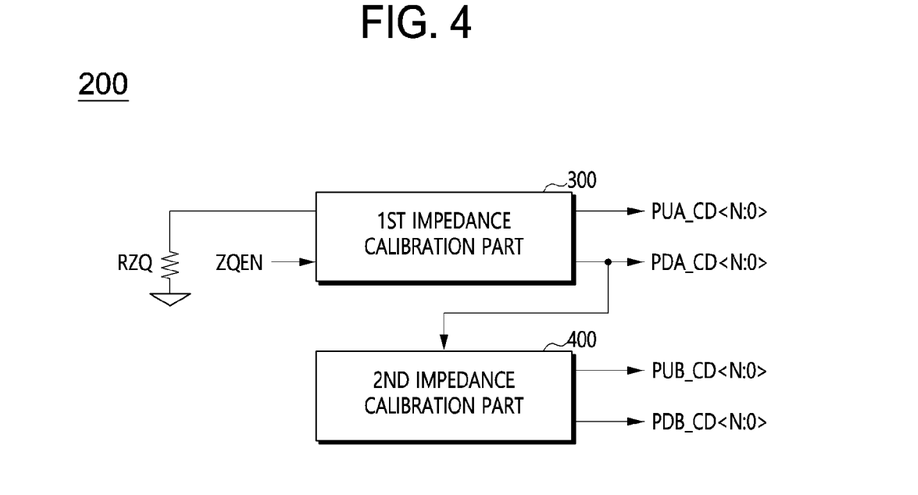
FIG. 4 is a diagram illustrating a configuration of an impedance calibration circuit illustrated in FIG. 3.

FIG. 4 is a diagram illustrating a configuration of the impedance calibration circuit 200 illustrated in FIG. 3.

Referring to FIG. 4, the impedance calibration circuit 200 may include a first impedance calibration part 300 and a second impedance calibration part 400.

The first impedance calibration part 300 may become coupled to the external resistor RZQ in response to the enablement of an impedance adjustment enable signal ZQEN. The first impedance calibration part 300 may be configured to perform a first impedance calibration operation of generating a first impedance calibration code set PUA_CD<N:0> and PDA_CD<N:0>. The first impedance calibration code set PUA_CD<N:0> and PDA_CD<N:0> may be for adjusting an impedance of a first terminating resistor to a first target value, with reference to the external resistance of the external resistor RZQ. The first impedance calibration part 300 may perform the first impedance calibration operation while the impedance adjustment enable signal ZQEN stays enabled. The first impedance calibration code set PUA_CD<N:0> and PDA_CD<N:0> may include a first pull-up code PUA_CD<N:0> and a first pull-down code PDA_CD<N:0>.

The second impedance calibration part 400 may be configured to perform a second impedance calibration operation of generating a second impedance calibration code set PUB_CD<N:0> and PDB_CD<N:0>. The second impedance calibration code set PUB_CD<N:0> and PDB_CD<N:0> may be for adjusting an impedance of a second terminating resistor to a second target value, with reference to a reference resistance unit, a resistance value of which is set to a second resistance value according to the first pull-down code PDA_CD<N:0> of the first impedance calibration code set PUA_CD<N:0> and PDA_CD<N:0>. The second impedance calibration code set PUB_CD<N:0> and PDB_CD<N:0> may include a second pull-up code PUB_CD<N:0> and a second pull-down code PDB_CD<N:0>.

Without a separate enable signal, the second impedance calibration part 400 may operate according to the first pull-down code PDA_CD<N:0> from the first impedance calibration part 300. Therefore, the first impedance calibration operation and the second impedance calibration operation may be performed while the impedance adjustment enable signal ZQEN stays enabled.

Figure 5:
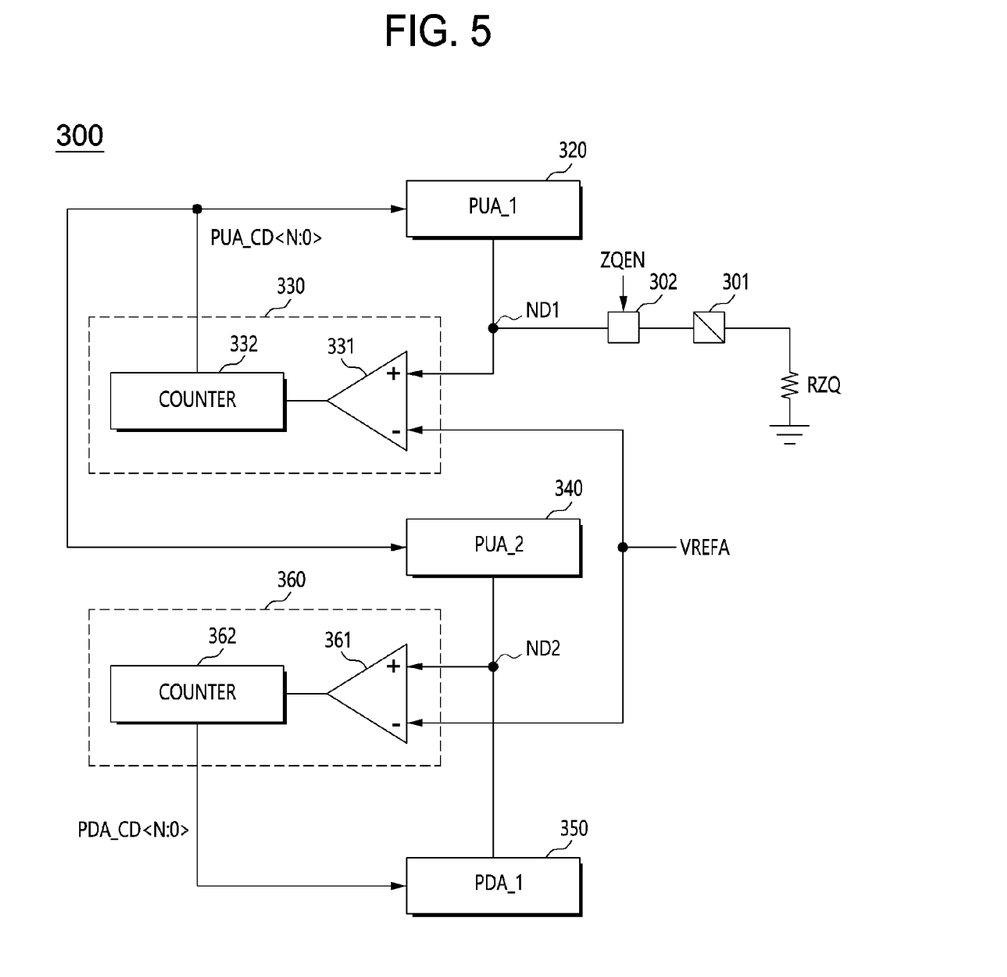
FIG. 5 is a diagram illustrating a configuration of a first impedance calibration part illustrated in FIG. 4.

FIG. 5 is a diagram illustrating a configuration of the first impedance calibration part 300 illustrated in FIG. 4.

Referring to FIG. 5, the first impedance calibration part 300 may include a first variable impedance unit (PUA_1) 320, a switching circuit 302, a first code generating circuit 330, a second variable impedance unit (PUA_2) 340, a third variable impedance unit (PDA_1) 350 and a second code generating circuit 360.

The first variable impedance unit 320 may adjust the impedance according to the first pull-up code PUA_CD<N:0>. For example, the first variable impedance unit 320 may have a replicated is configuration of the pull-up unit within the driver of the transceiver 201 illustrated in FIG. 3. The first variable impedance unit 320 may be coupled to a first node ND1. The first variable impedance unit 320 may be designed to have a target impedance, e.g., an impedance of 60 ohms. In other embodiments, the target impedance may be a value other than 60 ohms.

The switching circuit 302 may couple an external resistor pad 301 to the first node ND1 in response to the enablement of the impedance adjustment enable signal ZQEN. The external resistor pad 301 may be coupled to the switching circuit 302 at one end and may be coupled to the external resistor RZQ at the other end. When the impedance adjustment enable signal ZQEN becomes enabled, the external resistor RZQ may be coupled to the first variable impedance unit 320. The external resistor RZQ may be designed to have the first resistance value, e.g., a resistance value of 240 ohms. In other embodiments, the target impedance may be a value other than 240 ohms.

The first code generating circuit 330 may compare a voltage of the first node ND1 with a first reference voltage VREFA to adjust a value of the first pull-up code PUA_CD<N:0>. The first code generating circuit 330 may include a comparator 331 and a counter 332. The comparator 331 may output a result of the comparison between the voltage of the first node ND1 and the first reference voltage VREFA. The counter 332 may adjust the value of the first pull-up code PUA_CD<N:0> according to the output from the comparator 331.

The second variable impedance unit 340 may get the impedance adjusted according to the first pull-up code PUA_CD<N:0>. The second variable impedance unit 340 may have substantially the same configuration as the first variable impedance unit 320. The second variable impedance unit 340 may be coupled to a second node ND2. The second variable impedance unit 340 may be designed to have a target impedance, e.g., an impedance of 60 ohms. In other embodiments, the target impedance may be a value other than 60 ohms.

The third variable impedance unit 350 may adjust the impedance according to the first pull-down code PDA_CD<N:0>. For example, the third variable impedance unit 350 may have a replicated configuration of the pull-down unit within the driver of the transceiver 201 illustrated in FIG. 3. The third variable impedance unit 350 may be coupled to the second node ND2. The third variable impedance unit 350 may be designed to have a target impedance, e.g., an impedance of 240 ohms. In other embodiments, the target impedance may be a value other than 240 ohms.

The second code generating circuit 360 may compare a voltage of the second node ND2 with the first reference voltage VREFA to adjust a value of the first pull-down code PDA_CD<N:0>. The second code generating circuit 360 may include a comparator 361 and a counter 362. The comparator 361 may output a result of the comparison between the voltage of the second node ND2 and the first is reference voltage VREFA. The counter 362 may adjust the value of the first pull-down code PDA_CD<N:0> according to the output from the comparator 361.

The first reference voltage VREFA may have a voltage level according to the high tapped termination (HTT) of the specification of DDR4, i.e., a voltage level corresponding to 'power voltage*0.8'. Because the first reference voltage VREFA has the voltage level corresponding to 'power voltage*0.8', corrected may be a difference between actual impedances and the target impedances of the first variable impedance unit 320, the second variable impedance unit 340 and the third variable impedance unit 350.

The driver within the transceiver 201 may be designed to have various drivability for interfacing with an external system and the impedance value should be variable according to the set drivability. Therefore, the first variable impedance unit 320 and the third variable impedance unit 350 may have the replicated configurations of the driver within the transceiver 201 illustrated in FIG. 3 and thus may be designed to have various impedances. Each of the first variable impedance unit 320 and the third variable impedance unit 350 may include a plurality of sub-units coupled to each other in parallel and may be designed to have various impedances according to selective combination of the sub-units.

Figure 6:
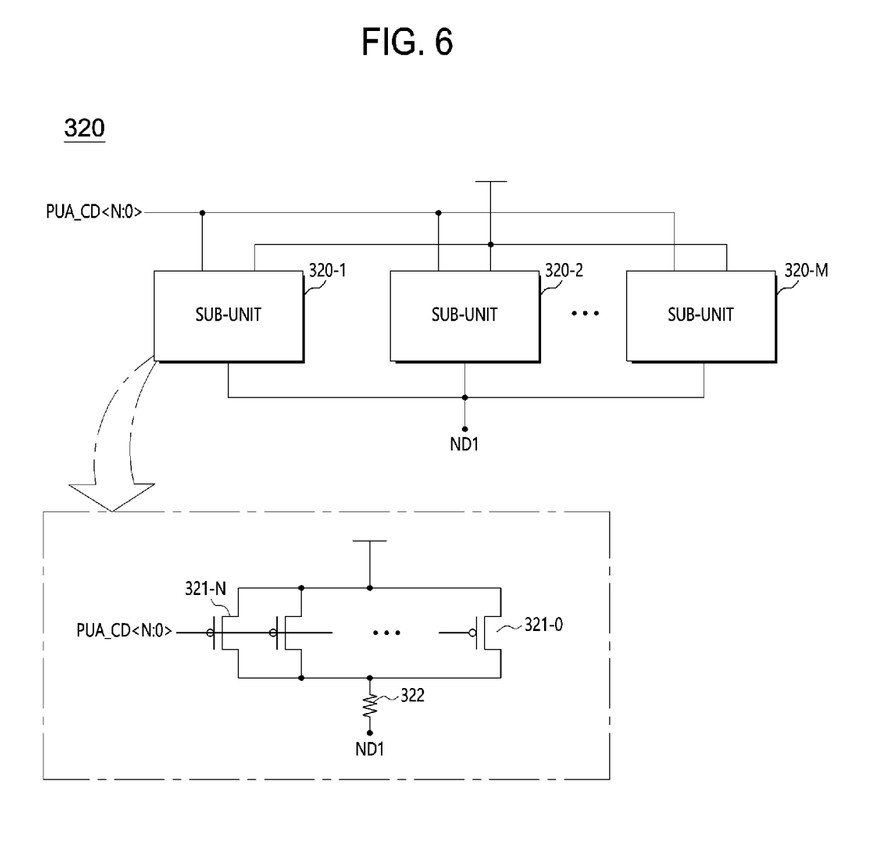
FIG. 6 is a diagram illustrating a configuration of a first variable impedance unit illustrated in FIG. 5.

FIG. 6 is a diagram illustrating a configuration of the first variable impedance unit 320 illustrated in FIG. 5.

Referring to FIG. 6, the first variable impedance unit 320 may is include a plurality of sub-units 320-1 to 320-M.

The plurality of sub-units 320-1 to 320-M may be coupled to each other in parallel between a power node and the first node ND1. The plurality of sub-units 320-1 to 320-M may commonly receive the first pull-up code PUA_CD<N:0>. Each of the plurality of sub-units 320-1 to 320-M may be selectively activated. That is, one, a part or a whole of the plurality of sub-units 320-1 to 320-M may be activated. The plurality of sub-units 320-1 to 320-M may have substantially the same circuit configuration as each other.

The sub-unit 320-1 may include a plurality of transistors 321-0 to 321-N and a resistor 322. Each of the plurality of transistors 321-0 to 321-N may be coupled to the power node at its source and may receive a corresponding bit of the first pull-up code PUA_CD<N:0> at its gate. The resistor 322 may be commonly coupled to drains of the plurality of transistors 321-0 to 321-N at one end and may be coupled to the first node ND1 at the other end. Each of the plurality of transistors 321-0 to 321-N may be selectively turned on according to a corresponding bit of the first pull-up code PUA_CD<N:0>. Therefore, the impedance of the first variable impedance unit 320 may be adjusted.

Figure 7:
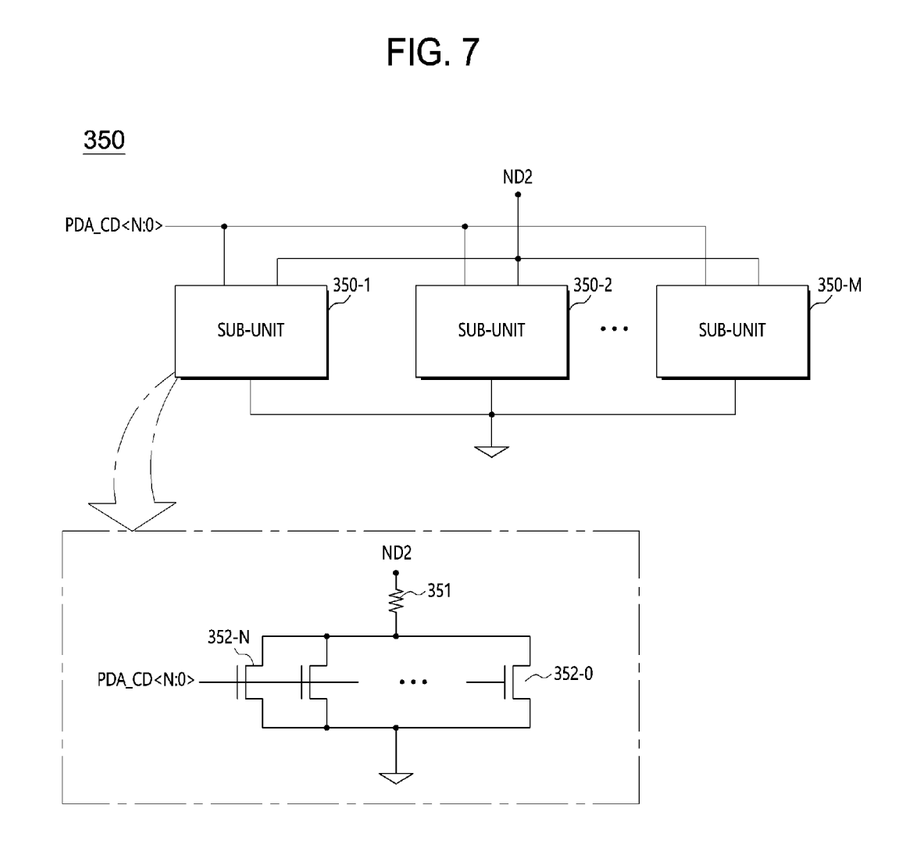
FIG. 7 is a diagram illustrating a configuration of a third variable impedance unit illustrated in FIG. 5.

FIG. 7 is a diagram illustrating a configuration of the third variable impedance unit 350 illustrated in FIG. 5.

Referring to FIG. 7, the third variable impedance unit 350 may include a plurality of sub-units 350-1 to 350-M. The plurality of sub-units 350-1 to 350-M may be coupled to each other in parallel is between a ground terminal and the second node ND2. The plurality of sub-units 350-1 to 350-M may commonly receive the first pull-down code PDA_CD<N:0>. Each of the plurality of sub-units 350-1 to 350-M may be selectively activated. That is, one, a part or a whole of the plurality of sub-units 350-1 to 350-M may be activated. The plurality of sub-units 350-1 to 350-M may have substantially the same circuit configuration as each other.

The sub-unit 350-1 may include a resistor 351 and a plurality of transistors 352-0 to 352-N. Each of the plurality of transistors 352-0 to 352-N may be coupled to a ground node at its source and may receive a corresponding bit of the first pull-down code PDA_CD<N:0> at its gate. The resistor 351 may be coupled to the second node ND2 at one end and may be commonly coupled to drains of the plurality of transistors 352-0 to 352-N at the other end. Each of the plurality of transistors 352-0 to 352-N may be selectively turned on according to a corresponding bit of the first pull-down code PDA_CD<N:0>. Therefore, the impedance of the third variable impedance unit 350 may be adjusted.

Figure 8:
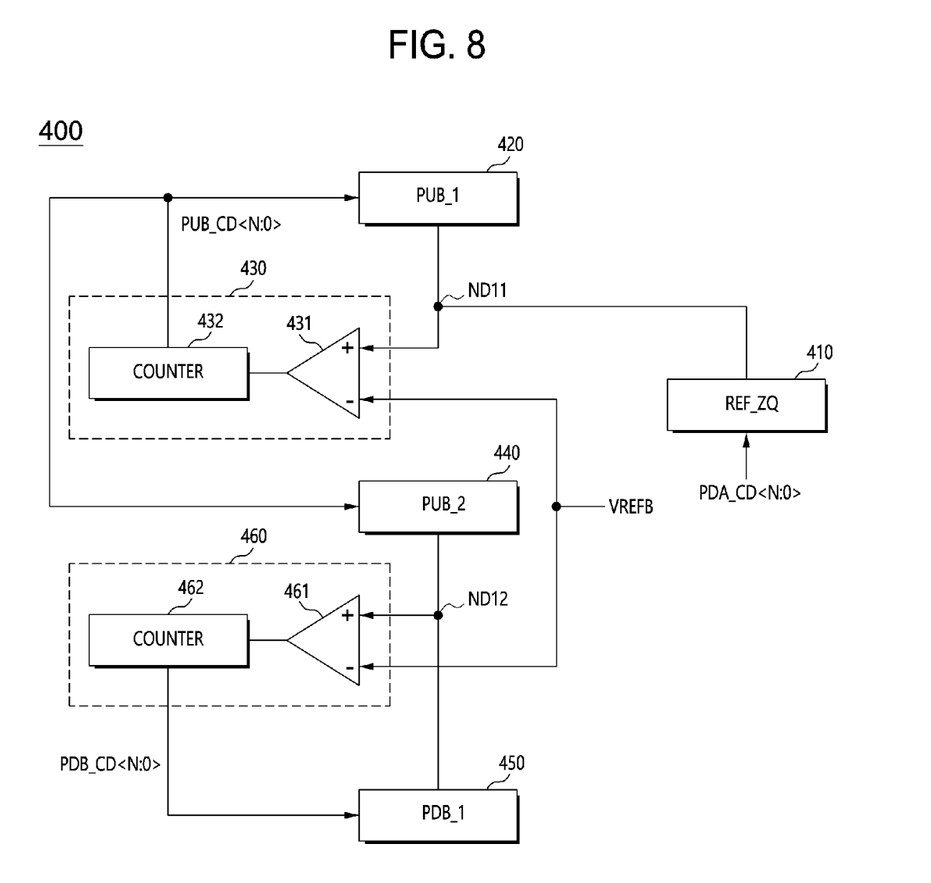
FIG. 8 is a diagram illustrating a configuration of a second impedance calibration part illustrated in FIG. 4.

FIG. 8 is a diagram illustrating a configuration of the second impedance calibration part 400 illustrated in FIG. 4.

Referring to FIG. 8, the second impedance calibration part 400 may include a reference resistance unit 410, a fourth variable impedance unit (PUB_1) 420, a third code generating circuit 430, a fifth variable impedance unit (PUB_2) 440, a sixth variable impedance unit (PDB_1) 450 and a fourth code generating circuit 460.

According to the first pull-down code PDA_CD<N:0>, a resistance value of the reference resistance unit 410 may be set to a second resistance value, e.g., 200 ohms. In other embodiments, the second resistance value may be a value other than 200 ohms. The reference resistance unit 410 may be coupled to a third node ND11. The reference resistance unit 410 may be configured by combination of a passive resistor and a variable resistor. The passive resistor may be designed to have an impedance near a target impedance, i.e., 200 ohms. In other embodiments, the target impedance may be a value other than 200 ohms. The variable resistor may be designed to have an impedance that can be adjusted according to the first pull-down code PDA_CD<N:0> such that the reference resistance unit 410 has the impedance of 200 ohms within the margin of error. In other embodiments, the impedance may be a value other than 200 ohms.

The fourth variable impedance unit 420 may get the impedance adjusted according to the second pull-up code PUB_CD<N:0>. For example, the fourth variable impedance unit 420 may have a replicated configuration of the pull-up unit within the driver of the receiver 202 illustrated in FIG. 3 and may have a similar configuration to the circuit illustrated in FIG. 6. The fourth variable impedance unit 420 may be coupled to the third node ND11. The fourth variable impedance unit 420 may be designed to have a target impedance of 200 ohms. In other embodiments, the target impedance may be a value other than 200 ohms.

The third code generating circuit 430 may compare a voltage is of the third node ND11 with a second reference voltage VREFB to adjust a value of the second pull-up code PUB_CD<N:0>. The third code generating circuit 430 may include a comparator 431 and a counter 432. The comparator 431 may output a result of the comparison between the voltage of the third node ND11 and the second reference voltage VREFB. The counter 432 may adjust the value of the second pull-up code PUB_CD<N:0> according to the output from the comparator 431.

The fifth variable impedance unit 440 may adjust the impedance according to the second pull-up code PUB_CD<N:0>. The fifth variable impedance unit 440 may have substantially the same configuration as the fourth variable impedance unit 420. The fifth variable impedance unit 440 may be coupled to a fourth node ND12. The fifth variable impedance unit 440 may be designed to have a target impedance of 600 ohms. In other embodiments, the target impedance may be a value other than 600 ohms.

The sixth variable impedance unit 450 may adjust the impedance according to the second pull-down code PDB_CD<N:0>. For example, the sixth variable impedance unit 450 may have a replicated configuration of the pull-down unit within the driver of the receiver 202 illustrated in FIG. 3 and may have a similar configuration to the circuit illustrated in FIG. 7. The sixth variable impedance unit 450 may be coupled to the fourth node ND12. The sixth variable impedance unit 450 may be designed to have a target impedance of 600 ohms. In other embodiments, the target impedance may be a value other than 600 ohms.

The fourth code generating circuit 460 may compare a voltage of the fourth node ND12 with the second reference voltage VREFB to adjust a value of the second pull-down code PDB_CD<N:0>. The fourth code generating circuit 460 may include a comparator 461 and a counter 462. The comparator 461 may output a result of the comparison between the voltage of the fourth node ND12 and the second reference voltage VREFB. The counter 462 may adjust the value of the second pull-down code PDB_CD<N:0> according to the output from the comparator 461.

The second reference voltage VREFB may have a voltage level according to the center tapped termination (CU) of the specification of DDR4 registering clock driver (RCD) input bus termination (IBT), i.e., a voltage level corresponding to 'power voltage*0.5'. Because the second reference voltage VREFB has the voltage level corresponding to 'power voltage*0.5', corrected may be difference between actual impedances and the target impedances of the fourth variable impedance unit 420, the fifth variable impedance unit 440 and the sixth variable impedance unit 450.

Figure 9:
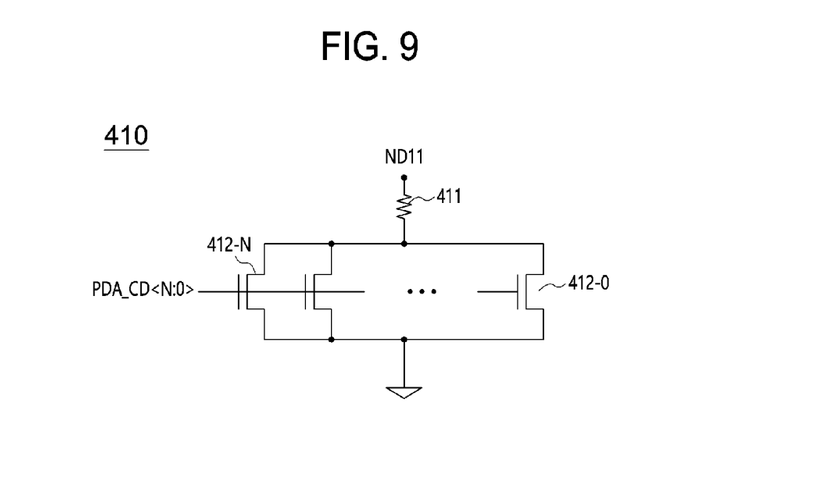
FIG. 9 is a diagram illustrating a configuration of a reference resistance unit illustrated in FIG. 8.

FIG. 9 is a diagram illustrating a configuration of the reference resistance unit 410 illustrated in FIG. 8.

Referring to FIG. 9, a single reference impedance may be implemented within the reference resistance unit 410, which is different from the variable impedance units described with reference to FIGS. 6 and 7. Therefore, the reference resistance unit 410 may have is a single sub-unit corresponding to one of the plurality of sub-units 350-1 to 350-M within the third variable impedance unit 350 illustrated in FIG. 7.

The reference resistance unit 410 may include a resistor 411 and a plurality of transistors 412-0 to 412-N. Each of the plurality of transistors 412-0 to 412-N may be coupled to a ground terminal at its source and may receive a corresponding bit of the first pull-down code PDA_CD<N:0> at its gate. The resistor 411 may be coupled to the third node ND11 at one end and may be commonly coupled to drains of the plurality of transistors 412-0 to 412-N at the other end. Each of the plurality of transistors 412-0 to 412-N may be selectively turned on according to a corresponding bit of the first pull-down code PDA_CD<N:0>. Therefore, the impedance of the reference resistance unit 410 may be adjusted to become 200 ohms within the margin of error. For example, the passive resistor within the reference resistance unit 410, i.e., the resistor 411 may be designed to have the target impedance of 160 ohms and the variable resistor within the reference resistance unit 410, i.e., the plurality of transistors 412-0 to 412-N may be designed to have the target impedance of 40 ohms. In other embodiments, the target impedances may be a value other than 40 ohms and 160 ohms. The difference between the actual impedance and the target impedance of the plurality of transistors 412-0 to 412-N may be corrected according to the first pull-down code PDA_CD<N:0> and therefore the reference resistance unit 410 may have the impedance of 200 ohms within the margin of error. In other embodiments, the impedance may be a value other than 200 ohms. The first pull-down code PDA_CD<N:0> may be a code signal for correcting the difference between the actual impedance and the target impedance of 240 ohms of the third variable impedance unit 350. In other embodiments, the target impedance may be a value other than 240 ohms. An impedance of transistor may have a characteristic of proportion to a drain-source voltage Vds. As the reference resistance unit 410 has the target impedance of 200 ohms, the plurality of transistors 412-0 to 412-N therein may be designed to have the target impedance of 40 ohms, which is less than the third variable impedance unit 350. In other embodiments, the target impedances may be values other than 200 ohms and 40 ohms. Therefore, in an embodiment, the impedance of the reference resistance unit 410 may be finely tuned to become 200 ohms according to the first pull-down code PDA_CD<N:0>.

Hereinafter, described will be the operation of the impedance calibration circuit 200.

The impedance adjustment enable signal ZQEN may be enabled according to a program sequence of the memory controller 101 and/or a request from a host and therefore the impedance calibration operation may be performed.

As the impedance adjustment enable signal ZQEN becomes enabled, the external resistor RZQ may be coupled to the first impedance calibration part 300.

The first impedance calibration part 300 may perform, with reference to the external resistor RZQ, the first impedance calibration is operation of adjusting the first pull-up code PUA_CD<N:0> and the first pull-down code PDA_CD<N:0> according to the comparison of the first reference voltage VREFA with each of the voltages of the first node ND1 and the second node ND2.

The first pull-up code PUA_CD<N:0> and the first pull-down code PDA_CD<N:0> may be adjusted until each of the voltages of the first node ND1 and the second node ND2 becomes substantially the same as the first reference voltage VREFA.

As each of the voltages of the first node ND1 and the second node ND2 becomes substantially the same as the first reference voltage VREFA, the difference between the actual impedance and the target impedance of each of the first variable impedance unit 320, the second variable impedance unit 340 and the third variable impedance unit 350 may be corrected and the first impedance calibration operation may be completed.

The second impedance calibration part 400 may perform, while the impedance adjustment enable signal ZQEN stays enabled, the second impedance operation of adjusting the second pull-up code PUB_CD<N:0> and the second pull-down code PDB_CD<N:0> by comparing, with reference to the reference resistance unit 410, the resistance value of which is set according to the first pull-down code PDA_CD<N:0>, the second reference voltage VREFB with each of the voltages of the third node ND11 and the fourth node ND12, at the same time with the first impedance calibration operation.

The second pull-up code PUB_CD<N:0> and the second pull-down code PDB_CD<N:0> may be adjusted until each of the third node ND11 and the fourth node ND12 becomes substantially the same as the second reference voltage VREFB.

As each of the third node ND11 and the fourth node ND12 becomes substantially the same as the second reference voltage VREFB, the difference between the actual impedance and the target impedance of each of the fourth variable impedance unit 420, the fifth variable impedance unit 440 and the sixth variable impedance unit 450 may be corrected and the second impedance calibration operation may be completed.

As described above, the first impedance calibration operation and the second impedance calibration operation may be started at the same time and completed after a predetermined time amount during an impedance adjustment section, i.e., while the impedance adjustment enable signal ZQEN stays enabled.

While certain embodiments have been described above, it will be understood to those skilled in the art that the embodiments described are by way of example only. Accordingly, the impedance calibration circuit, the memory controller including the impedance calibration circuit and the memory system including the memory controller should not be limited based on the described embodiments. Rather, the impedance calibration circuit, the memory controller including the impedance calibration circuit and the memory system including the memory controller described herein should only be limited in light of the claims that follow when taken in conjunction with the above description and accompanying drawings.

What is claimed is:

1. An impedance calibration circuit comprising:
a first impedance calibration part configured to perform a first impedance calibration operation of generating a first impedance calibration code set for adjusting an impedance of a first terminating resistor to a first target value, with reference to an external resistor having a first resistance value; and
a second impedance calibration part configured to perform a second impedance calibration operation of generating a second impedance calibration code set for adjusting an impedance of a second terminating resistor to a second target value, with reference to a reference resistance unit, a resistance value of which is set to a second resistance value according to a part of the first impedance calibration code set.

2. The impedance calibration circuit of claim 1, wherein the first impedance calibration part is configured to perform the first impedance calibration operation while the first impedance calibration part is connected to the external resistor and the second impedance calibration part is configured to perform the second impedance calibration operation while the first impedance calibration operation is being performed.

3. The impedance calibration circuit of claim 1, further comprising:
an external resistor pad coupled to the external resistor; and
a switching circuit configured to couple the external resistor pad to the first impedance calibration part in response to an impedance adjustment enable signal.

4. The impedance calibration circuit of claim 1, wherein the second impedance calibration part is directly coupled to the first impedance calibration part and receive a part of the first impedance calibration code set.

5. The impedance calibration circuit of claim 1, wherein the first impedance calibration part includes:
a first variable impedance unit coupled to the external resistor through a first node and configured to receive a pull-up code of the first impedance calibration code set;
a first code generating circuit configured to adjust a value of the pull-up code according to a result of comparing a voltage of the first node with a reference voltage;
a second variable impedance unit coupled to a second node and configured to receive the pull-up code;
a third variable impedance unit coupled to the second node and configured to receive a pull-down code of the second impedance calibration code set; and
a second code generating circuit configured to adjust a value of the pull-down code according to a result of comparing a voltage of the second node with the reference voltage.

6. The impedance calibration circuit of claim 1, wherein the second impedance calibration part includes:
the reference resistance unit coupled to a first node and configured to receive a pull-down code of the first impedance calibration code set;
a first variable impedance unit coupled to the first node and configured to receive a pull-up code of the second impedance calibration code set;
a first code generating circuit configured to adjust a value of the pull-up code according to a result of comparing a voltage of the first node with a reference voltage;
a second variable impedance unit coupled to a second node and is configured to receive the pull-up code;
a third variable impedance unit coupled to the second node and configured to receive a pull-down code of the second impedance calibration code set; and
a second code generating circuit configured to adjust a value of the pull-down code according to a result of comparing a voltage of the second node with the reference voltage.

7. A memory controller comprising:
a front physical layer including a first terminating resistor and a second terminating resistor, which have different terminating resistor specifications from each other, and configured to perform an interfacing operation with a host;
a back physical layer configured to perform an interfacing operation with at least one memory apparatus; and
a processor configured to process a signal between the front physical layer and the back physical layer,
wherein the front physical layer is configured to perform a first impedance calibration operation of generating a first impedance calibration code set and configured to perform a second impedance calibration operation of generating a second impedance calibration code set,
wherein the first impedance calibration code set is for adjusting an impedance of the first terminating resistor to a first target value, with reference to an external resistor having a first resistance value, and wherein the second impedance calibration code set is for adjusting an impedance of the second terminating resistor to a second target value, with reference to a reference resistance unit, a resistance value of which is set to a second resistance value according to a part of the first impedance calibration code set.

8. The memory controller of claim 7, wherein the front physical layer is configured to perform the first impedance calibration operation while the front physical layer is connected to the external resistor and configured to perform the second impedance calibration operation while the first impedance calibration operation is being performed.

9. The memory controller of claim 7, wherein the front physical layer includes:
   a transceiver including the first terminating resistor that is coupled to a data input/output node;
   a receiver including the second terminating resistor that is coupled to a command and address (command/address) input terminal; and
   an impedance calibration circuit configured to perform the first impedance calibration operation while the front physical layer is connected to the external resistor and configured to perform the second impedance calibration operation while the first impedance calibration operation is being performed.

10. The memory controller of claim 9, wherein the impedance calibration circuit includes:
   an external resistor pad coupled to the external resistor; and
   a switching circuit configured to couple the external resistor pad to the impedance calibration circuit in response to an impedance adjustment enable signal.

11. The memory controller of claim 7, wherein the front physical layer includes:
   a first variable impedance unit coupled to the external resistor through a first node and configured to receive a first pull-up code of the first impedance calibration code set;
   a first code generating circuit configured to adjust a value of the first pull-up code according to a result of comparing a voltage of the first node with a first reference voltage;
   a second variable impedance unit coupled to a second node and configured to receive the first pull-up code;
   a third variable impedance unit coupled to the second node and configured to receive a first pull-down code of the first impedance calibration code set;
   a second code generating circuit configured to adjust a value of the first pull-down code according to a result of comparing a voltage of the second node with the first reference voltage;
   the reference resistance unit coupled to a third node and configured to receive the first pull-down code;
   a fourth variable impedance unit coupled to the third node and configured to receive a second pull-up code of the second impedance calibration code set;
   a third code generating circuit configured to adjust a value of the second pull-up code according to a result of comparing a voltage of the third node with a second reference voltage;
   a fifth variable impedance unit coupled to a fourth node and configured to receive the second pull-up code;
   a sixth variable impedance unit coupled to the fourth node and configured to receive the second pull-down code; and a fourth code generating circuit configured to adjust a value of the second pull-down code according to a result of comparing a voltage of the fourth node with the second reference voltage.

12. A memory system comprising:
   a memory apparatus; and
   a memory controller configured to control the memory apparatus in response to a request from a host and including a first terminating resistor and a second terminating resistor, which have different terminating resistor specifications from each other according to the memory apparatus,
   wherein the memory controller is configured to perform a first impedance calibration operation of generating a first impedance is calibration code set and configured to perform a second impedance calibration operation of generating a second impedance calibration code set,
   wherein the first impedance calibration code set is for adjusting an impedance of the first terminating resistor to a first target value, with reference to an external resistor having a first resistance value, and
   wherein the second impedance calibration code set is for adjusting an impedance of the second terminating resistor to a second target value, with reference to a reference resistance unit, a resistance value of which is set to a second resistance value according to a part of the first impedance calibration code set.

13. The memory system of claim 12, wherein the memory apparatus and the memory controller configure a dual in-line memory module.

14. The memory system of claim 12, wherein the memory controller includes:
   a front physical layer configured to perform an interfacing operation with the host;
   a back physical layer configured to perform an interfacing operation with the memory apparatus; and
   a processor configured to process a signal between the front physical layer and the back physical layer,
   wherein the front physical layer is configured to perform the first impedance calibration operation while the front physical layer is connected to the external resistor and configured to perform the second impedance calibration operation while the first impedance calibration operation is being performed.

15. The memory system of claim 14, wherein the front physical layer includes:
   a transceiver including the first terminating resistor that is coupled to a data input/output terminal;
   a receiver including the second terminating resistor that is coupled to a command and address (command/address) input terminal; and
   an impedance calibration circuit configured to perform the first impedance calibration operation while the front physical layer is connected to the external resistor and configured to perform the second impedance calibration operation while the first impedance calibration operation is being performed.

16. The memory system of claim 15, wherein the impedance calibration circuit includes:
   a first variable impedance unit coupled to the external resistor through a first node and configured to receive a first pull-up code of the first impedance calibration code set;
   a first code generating circuit configured to adjust a value of the first pull-up code according to a result of comparing a voltage of the first node with a first reference voltage;

a second variable impedance unit coupled to a second node and configured to receive the first pull-up code;

a third variable impedance unit coupled to the second node and configured to receive a first pull-down code of the first impedance calibration code set;

a second code generating circuit configured to adjust a value of the first pull-down code according to a result of comparing a voltage of the second node with the first reference voltage;

the reference resistance unit coupled to a third node and configured to receive the first pull-down code;

a fourth variable impedance unit coupled to the third node and configured to receive a second pull-up code of the second impedance calibration code set;

a third code generating circuit configured to adjust a value of the second pull-up code according to a result of comparing a voltage of the third node with a second reference voltage;

a fifth variable impedance unit coupled to a fourth node and configured to receive the second pull-up code;

a sixth variable impedance unit coupled to the fourth node and configured to receive the second pull-down code; and a fourth code generating circuit configured to adjust a value of the second pull-down code according to a result of comparing a voltage of the fourth node with the second reference voltage.

* * * * *